United States Patent [19]
Jang et al.

[11] Patent Number: 6,051,961
[45] Date of Patent: Apr. 18, 2000

[54] SOFT-SWITCHING CELL FOR REDUCING SWITCHING LOSSES IN PULSE-WIDTH-MODULATED CONVERTERS

[75] Inventors: Yungtaek Jang, Apex; Milan M. Jovanovic, Cary, both of N.C.

[73] Assignee: Delta Electronics, Inc., Taipei, Taiwan

[21] Appl. No.: 09/250,789

[22] Filed: Feb. 11, 1999

[51] Int. Cl.[7] ................................................. G05F 1/613
[52] U.S. Cl. ........................ 323/224; 323/271; 323/225; 363/56
[58] Field of Search ................................. 363/50, 53, 55, 363/56, 16, 89, 97, 134; 323/222, 224, 225, 235, 238, 259, 271, 282

[56] References Cited

U.S. PATENT DOCUMENTS

| | | | |
|---|---|---|---|
| 3,467,852 | 9/1969 | Murray et al. | 363/134 |
| 5,146,399 | 9/1992 | Gucyski | 363/89 |
| 5,418,704 | 5/1995 | Hua et al. | 363/21 |
| 5,446,366 | 8/1995 | Bassett et al. | 323/222 |
| 5,736,842 | 4/1998 | Jovanovic | 323/222 |

OTHER PUBLICATIONS

"New Fast Recovery Diode Technology Cuts Circuit Losses, Improves Reliability", Y. Khersonsky, etc. PCIM, May 1992, pp. 16–25.

"High Efficiency Telecom Rectifier Using a Novel Soft–Switched Boost–Based Input Current Shaper", Robert Streit, Daniel Tollik, IEEE Intelec, Nov. 1991, pp. 720–726.

"Switched Snubber For High Frequency Switching", Koosuke Harada, Hiroshi Sakamoto, IEEE, 1990, pp. 181–188.

*Primary Examiner*—Jessica Han
*Attorney, Agent, or Firm*—Skjerven Morrill MacPherson Franklin & Friel LLP; Edward C. Kwok

[57] ABSTRACT

A circuit technique substantially reduces the switching losses of a pulse-width-modulated (PWM) converter caused by the turning-on (closing) and turning-off (opening) characteristic of the switch and the reverse-recovery characteristic of the rectifier. The losses are reduced by using a new switch cell which includes a snubber inductor, a clamp diode, a clamp capacitor, a main switch, and an auxiliary switch. The reverse-recovery-related losses are reduced by the snubber inductor connected in series with the main switch and the rectifier to control the rate of change of rectifier current during its turn-off. In addition, the main switch operates with zero-current and zero-voltage switching, while the auxiliary switch operates with zero-voltage switching. A proper operation of the proposed circuit requires overlapping gate drives of the main and the auxiliary switches. The circuit technique can be applied to any member of the PWM converter family.

23 Claims, 16 Drawing Sheets

SOFT-SWITCHING CELL FOR REDUCING SWITCHING LOSSES IN PULSE-WIDTH-MODULATED CONVERTERS

BACKGROUND OF THE INVENTION

1. Field of the Invention

The present invention relates to power converters. In particular, the present invention relates to pulse-width-modulated (PWM) converters.

2. Discussion of the Related Art

Generally, at a higher power level, a continuous-conduction-mode boost converter is a preferred implementation of a front-end converter with active input-current shaping. The output voltage of such a boost input-current shaper is relatively high, since the DC output voltage of the boost converter must be higher than the peak input voltage. Due to this high output voltage, a fast-recovery boost rectifier is required. At a high switching frequency, a fast-recovery rectifier produces a significant reverse-recovery-related loss when it is switched under a "hard-switching" condition. (See, for example, "New fast recovery diode technology cuts circuit losses, improves reliability," by Y. Kersonsky, M. Robinson, and D. Gutierrez, Power Conversion & Intelligent Motion (PCIM) Magazine, pp. 16–25, May 1992.) As a result, "hard-switched", boost input-current-shapers are operated at relatively low switching frequencies to avoid a significant deterioration of their conversion efficiencies. Using a soft-switching technique, the switching frequency and, therefore, the power-density of the boost, front-end converter can be increased.

So far, a number of soft-switched boost converters and their variations have been proposed. Some examples of soft-switched boost converters are disclosed in the following references: (a) "High efficiency telecom rectifier using a novel soft-switched boost-based input current shaper," ("Streit") by R. Streit, D. Tollik, International Telecommunication Energy Conf. (INTELEC) Proc., pp. 720–726, October 1991; (b) U.S. Pat. No. 5,418,704 ("Hua et al."), entitled "Zero-Voltage-Transition Pulse-Width-Modulated Converters" to G. Hua, F.C. Lee, issued May 23, 1995; (c) U.S. Pat. No. 5,446,336, entitled "Boost Converter Power Supply with Reduced Losses, Control Circuit and Method Therefor" ("Bassett et al.") to J. Bassett and A. B. Odell, issued Aug. 29, 1995; and (d) U.S. Pat. No. 5,736,842 ("Jovanovic"), entitled "Technique for reducing rectifier reverse-recovery-related losses in high-voltage, high-power converters," to M. Jovanovic, issued Apr. 7, 1998.

Each of the references (a)–(d) above discloses an auxiliary active switch operating together with a few passive components (e.g., inductors and capacitors), thus forming an active snubber that is used to control the rate of change of rectifier current (di/dt) and to create conditions for zero-voltage switching (ZVS) of the main switch and the rectifier. Active snubbers are described, for example, in "Switched snubber for high frequency switching," ("Harada et al.") by K. Harada, H. Sakamoto, IEEE Power Electronics Specialists' Conf (PESC) Rec., pp. 181–188, June 1990. FIGS. 1–3 show the soft-switched boost circuit introduced in Hua et al., Bassett et al., and Jovanovic, respectively.

The boost converter circuits proposed in Streit and Hua et al. use a snubber inductor connected to the common node of the boost switch and the rectifier to control the rate of change of rectifier current (di/dt). As a result of the snubber-inductor location, the main switch and the rectifier in the circuits proposed in Streit and Hua et al. possess minimum voltage and current stresses. In addition, the boost switch closes and the rectifier turns off under zero-voltage (soft-switching) conditions. However, the auxiliary switch operates under "hard" switching conditions, as it is closed while its voltage is equal to the output voltage, and subsequently opened while carrying a current greater than the input current.

In the circuits of Bassett et al. and Jovanovic, the rate of change of rectifier current is controlled by a snubber inductor connected in series with the boost switch and the rectifier. Because of this placement of the inductor, the voltage stress of the main switch is higher than that of the circuits described in Streit and Hua et al. This increased voltage stress can be minimized by a proper selection of the snubber-inductance value and the switching frequency, as taught in Jovanovic. Both the boost and the auxiliary switches in the circuits in Bassett et al. and Jovanovic, as well as the boost rectifier, operate under ZVS conditions.

The major deficiency of the boost converters described in Streit and Hua et al. is a severe, undesirable resonance between the output capacitance $C_{OSS}$ of the auxiliary switch and the resonant inductor. The undesirable resonance occurs after the auxiliary switch is opened and the snubber inductor current falls to zero and adversely affects the operation of the circuit and must be eliminated. For example, in the circuit introduced in Hua et al., the resonance is eliminated by connecting a rectifier and a saturable inductor in series with the snubber inductor, as shown in FIG. 1, which degrades the conversion efficiency and increases both the component count and the cost of the circuit.

The circuits described in Bassett et al. and Jovanovic require an isolated (high-side) gate drive, which increases circuit complexity and cost. Also, the circuit introduced in Jovanovic requires noise-robust gate-drive timing since accidental transient overlapping of the main and auxiliary switch gate drives may lead to a fatal circuit failure resulting from the relatively large transient current through the series connection of the simultaneously-conducting main and auxiliary switches. (The circuit introduced in Bassett et al. does not suffer from the overlapping gate-drive problem because it requires overlapping gate drive for proper operation.)

SUMMARY OF THE INVENTION

In this invention, a technique improves the performance of a PWM converter by eliminating switching losses. To eliminate switching losses, the present invention provides a zero-current, zero-voltage-switched (ZC-ZVS) cell which includes a snubber inductor, a clamp diode, a clamp capacitor, a main switch, and an auxiliary switch. The ZC-ZVS cell reduces reverse-recovery-related losses of the boost rectifier and also provides lossless switching for the main and auxiliary switches.

The ZC-ZVS cell of the present invention is applicable, for example, to soft-switched PWM boost converter. The reverse-recovery-related losses in the boost topology are reduced by the snubber inductor, which is connected in series with the main switch (boost switch) and the boost rectifier, and which controls the rate of current change (di/dt) in the boost rectifier during its turn-off. Moreover, the main switch operates with zero-current and zero-voltage switching, and the auxiliary switch operates with zero-voltage switching. A proper operation of a circuit of the present invention requires overlapping gate drives of the main and the auxiliary switches where the main switch becomes conducting or non-conducting prior to the auxiliary switch becoming conducting or non-conducting.

Specifically, when the main switch of the boost converter with the proposed ZC-ZVS cell becomes conducting, the snubber inductor controls the rate of change of the current in the boost rectifier to reduce reverse-recovery-related losses of the boost rectifier. In addition, since the snubber inductor prevents the main-switch current from increasing immediately, the main switch becomes conducting with zero-current switching. Further, during the conducting period of the main switch, the snubber inductor and the output capacitance of the auxiliary switch form a resonant circuit, so that the voltage across the auxiliary switch falls to zero by a resonant oscillation. As a result, the auxiliary switch becomes conducting when the voltage across it is zero.

During the period when both the main and the auxiliary switch are conducting, the snubber inductor and the clamp capacitor form yet another resonant circuit through the closed switches. Due to this resonance, the current through the main switch is reduced to zero prior to the main switch becoming non-conducting, while the voltage across the main switch is clamped to zero by the conducting clamp diode and the auxiliary switch. Thus, the main switch turns off with zero-current-zero-voltage switching.

Since the main and the auxiliary switches in a circuit of the present invention have their source terminals connected to the circuit ground, a non-isolated (direct) gate drive can be used. In addition, because the proper operation of the circuit requires that the conduction periods of the main and the auxiliary switches overlap, a circuit of the present invention is not susceptible to failures due to accidental transient overlapping of the main and auxiliary switch gate drives. Further, the voltage and current stresses of the components in an active-snubber boost converter of the present invention are similar to those in conventional "hard-switched" converters. The same technique can be extended to any member of the PWM-converter family.

The present invention is better understood upon consideration of the following detailed description and the accompanying drawings.

DETAILED DESCRIPTION OF THE PREFERRED EMBODIMENTS

Figure 1:
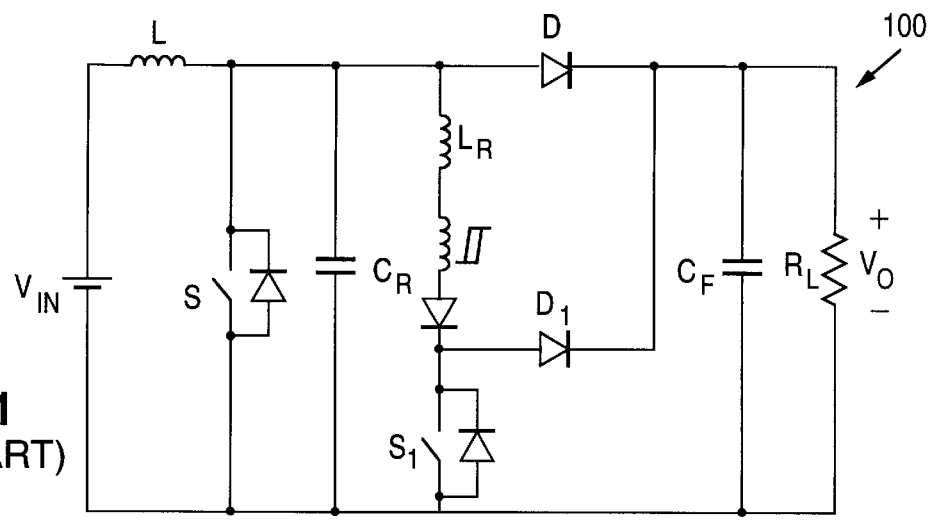
FIG. 1 shows boost power stage 100 with active snubber, as disclosed in Hua et al. (prior art).
Figure 2:
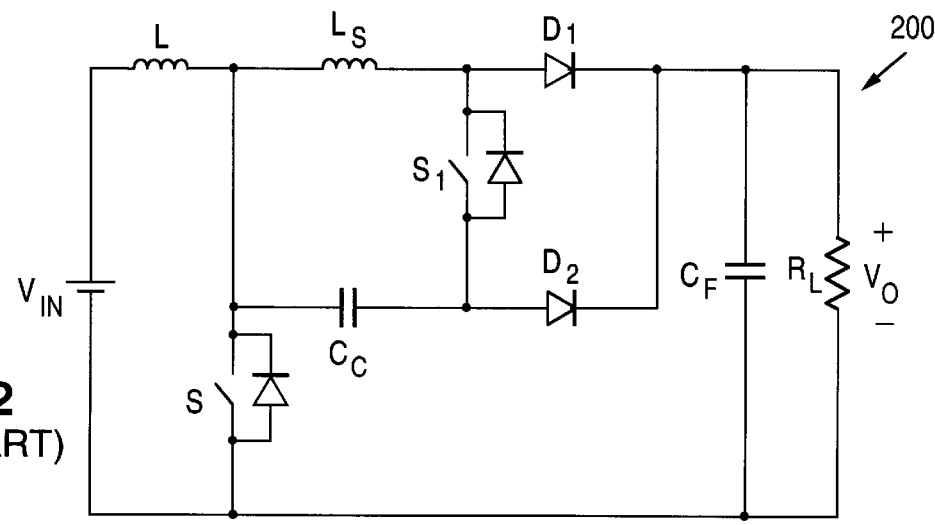
FIG. 2 shows boost power stage 200, with active snubber introduced in Bassett et al. (prior art).
Figure 3:
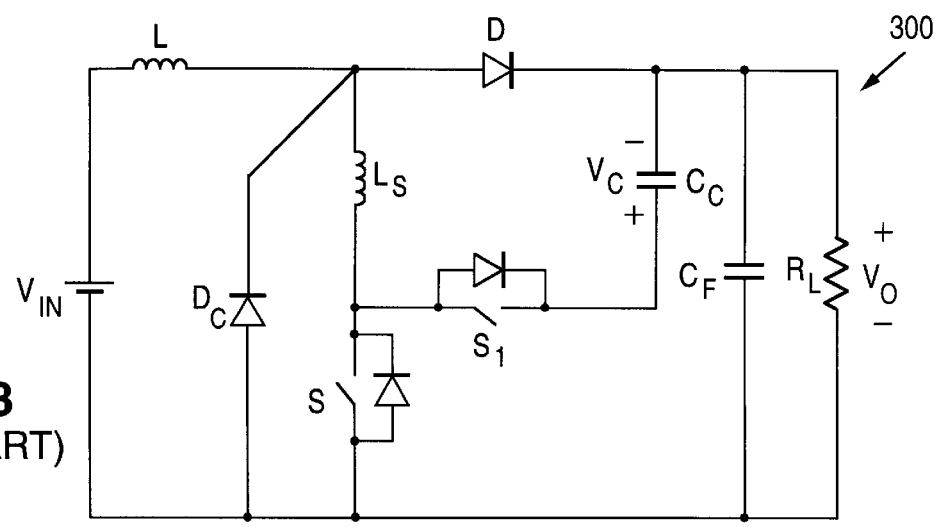
FIG. 3 shows boost power stage 300, with active snubber introduced in Jovanovic (prior art).
Figure 4:
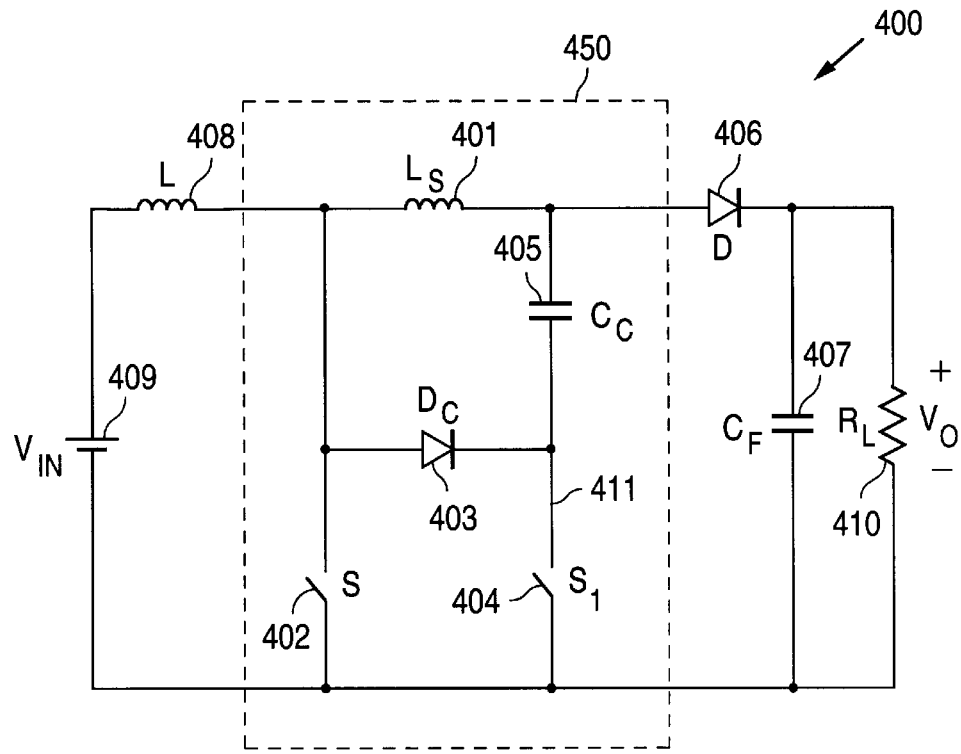
FIG. 4 shows boost power stage 400, with zero-current-zero-voltage-switched (ZC-ZVS) cell 450, in accordance with one embodiment of the present invention.

The present invention provides switching loss reduction in a PWM converter, such as boost power stage 400 of FIG. 4. Boost power stage 400 includes snubber inductor 401 (Ls), which is connected in series with main switch 402 (S) and boost rectifier 406. Snubber inductor 401 controls the rate of current change (di/dt) of boost rectifier 406. As shown in FIG. 4, main or boost switch 402, snubber inductor 401, auxiliary switch 404 ($S_1$), clamp capacitor 405 ($C_C$), and clamp diode 403 ($D_C$) form a zero-current-zero-voltage-switched (ZC-ZVS) cell 450. To simplify the detailed description below and to facilitate cross-reference among the various figures, like elements in the various figures are provided like reference numerals.

Figure 5:
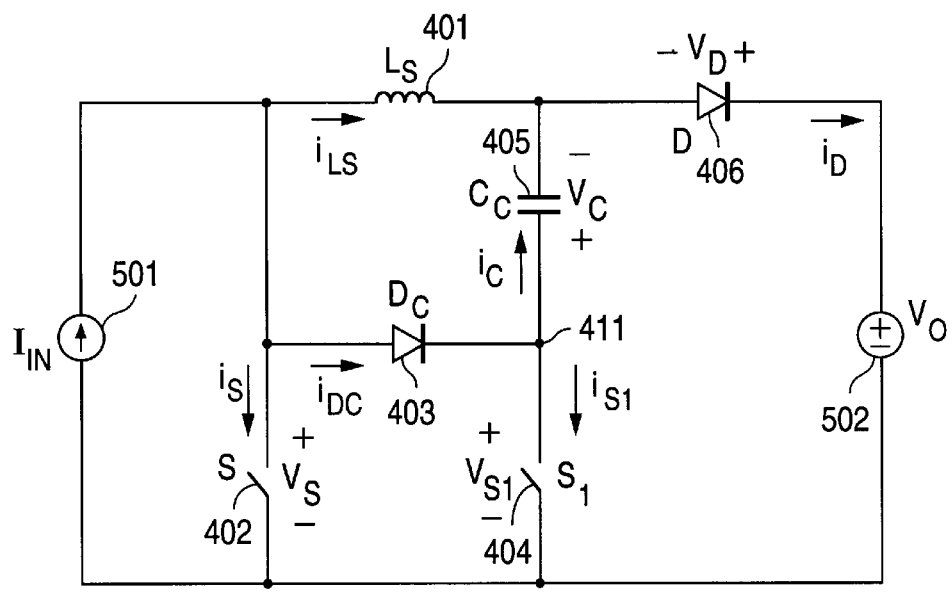
FIG. 5 shows a model of boost power stage 400, showing reference directions of currents and voltages.

A model of boost power stage 400 is provided in FIG. 5. Because the boost inductance (L) is large relative to other inductances of components of boost power stage 400, boost inductor 408 is represented by a constant-current source 501 ($I_{IN}$). Further, since the output-ripple voltage is negligible, voltage $V_O$ across output filter capacitor 407 is represented by constant-voltage source 502. When conducting, semiconductor devices (e.g., switches 402 and 404) can be regarded as having zero resistance (i.e., short circuits). Output capacitances of switches 402 and 404, and the reverse-recovery charge of boost rectifier 406 are not neglected.

FIGS. 6(a)–6(j) show topological stages of boost power stage 400 of FIG. 4 during a switching cycle in which input current $I_{IN}$ is greater than the peak current ($I_{LS(PK)}$) of snubber inductor 401. FIG. 7 shows key waveforms of boost power stage 400 during the same switching cycle. As shown in FIG. 7, the gate-drive waveforms (i.e., waveforms 701 and 702, for gate driving signals $G_S$, and $G_{S1}$, respectively) for boost switch 402 and auxiliary switch 404 are overlapping (i.e., boost switch 402 and auxiliary switch 404 are both conducting for some time period). An example of the overlapping period is the time period between time $t=T_4$ and time $t=T_6$.

Initially (i.e., prior to boost switch 402 closing at time $t=T_0$) input current $I_{IN}$ flows through snubber inductor 401 and boost rectifier 406. At the same time, output voltage $V_O$ is impressed across boost switch 402, and a voltage equal to the sum of output voltage $V_O$ and clamp-capacitor voltage $V_C$ across capacitor 405 (i.e., voltage $V_O+V_C$) is impressed across auxiliary switch 404.

Figure 6A:
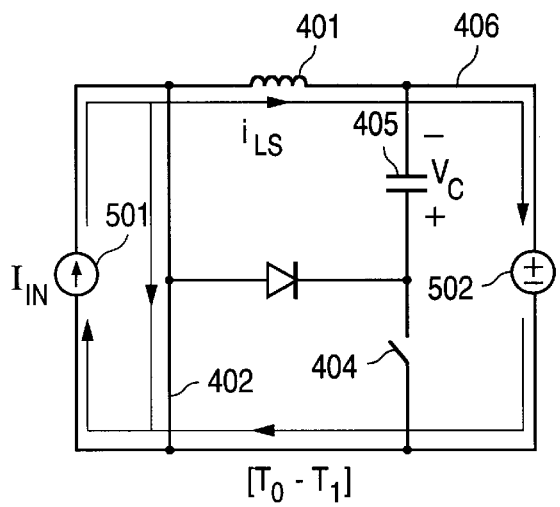
FIGS. 6(a)–6(j) show topological stages of boost power stage 400, in which input current $I_{IN}$ is greater than the peak current ($I_{LS(PK)}$) in snubber inductor 401.
Figure 7:
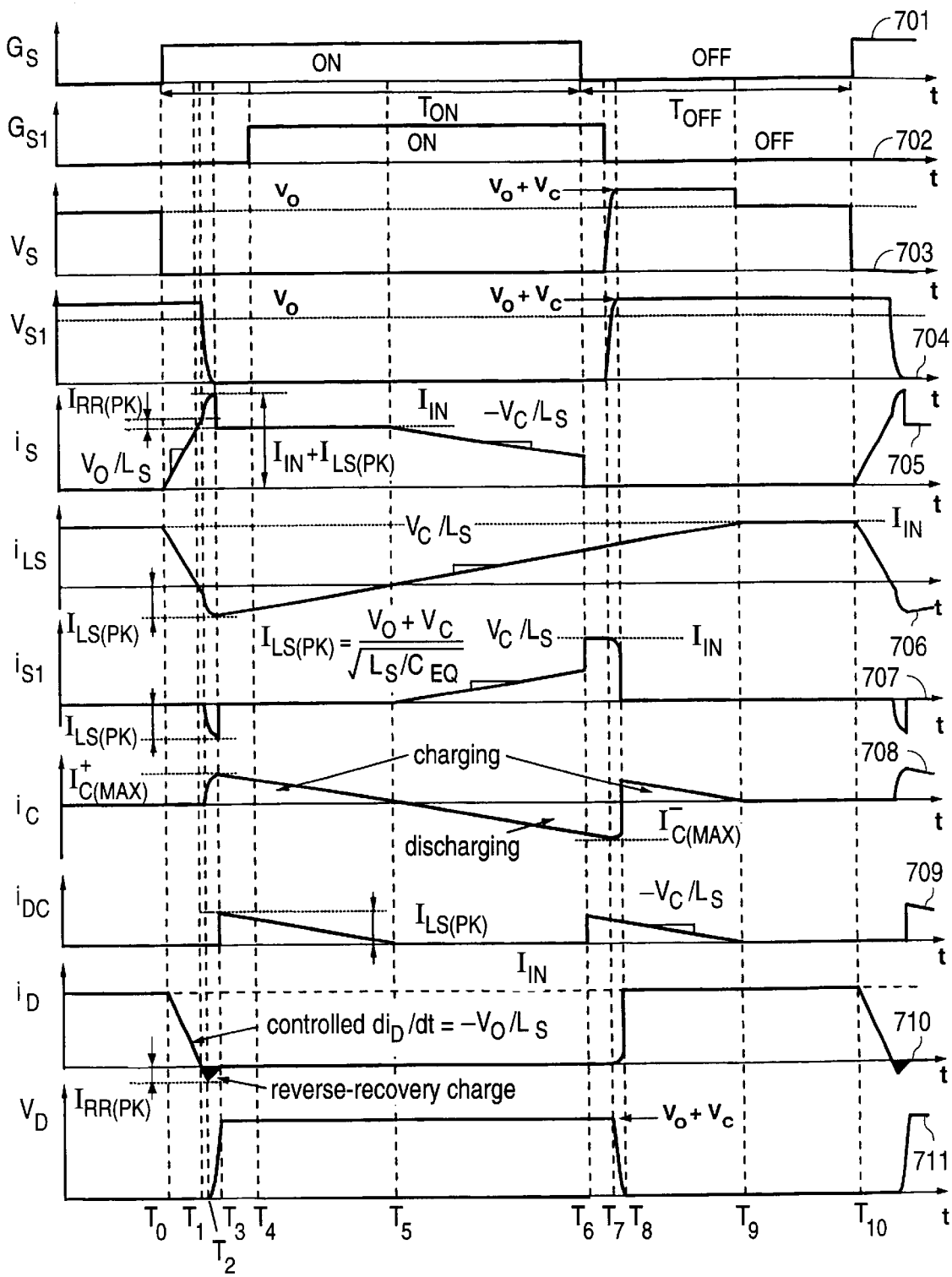
FIG. 7 shows key waveforms of boost power stage 400, when input current $I_{IN}$ is greater than the peak current ($I_{LS(PK)}$) in snubber inductor 401.
Figure 8A:
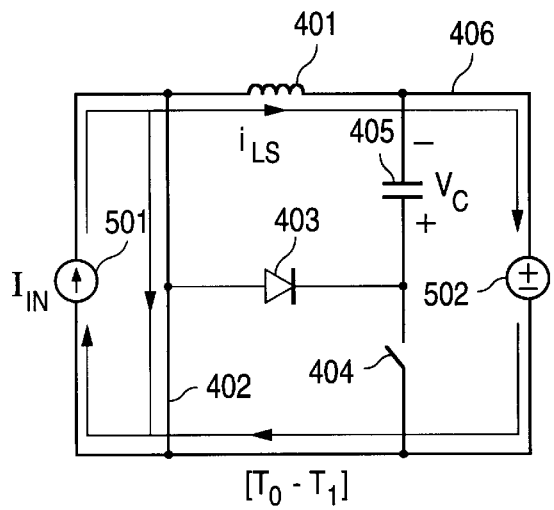
FIGS. 8(a)–8(j) show topological stages of boost power stage 400, in which input current $I_{IN}$ is less than the peak current ($I_{LS(PK)}$) in snubber inductor 401.
Figure 8B:
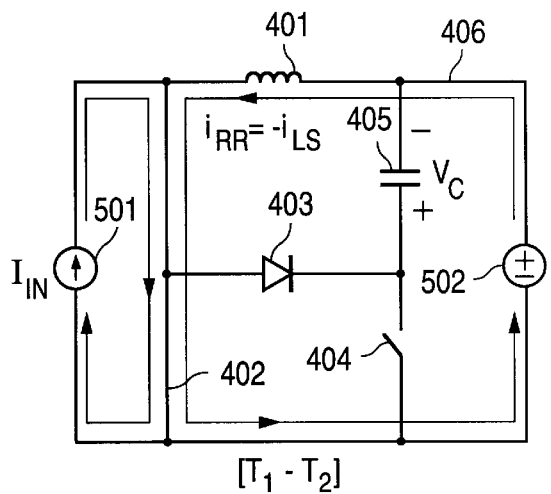
Figure 8C:
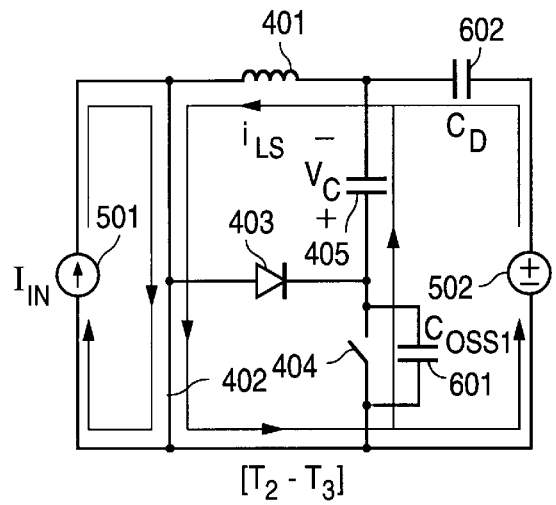
Figure 8D:
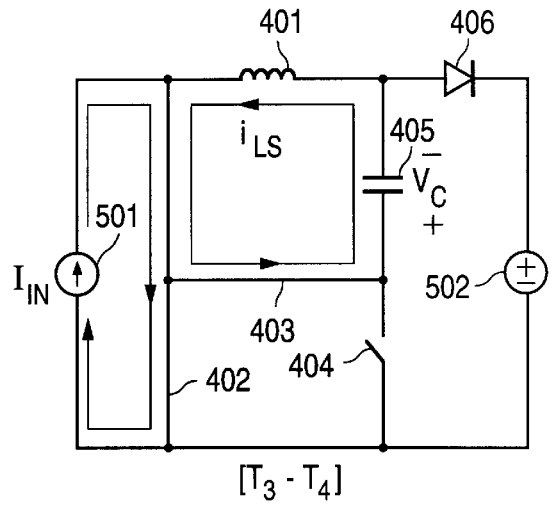
Figure 8E:
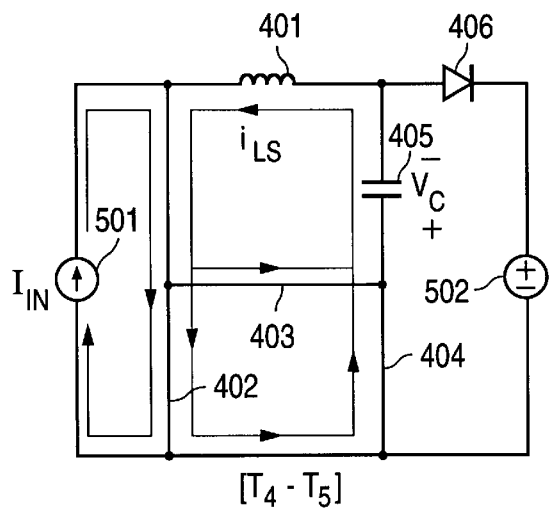
Figure 8F:
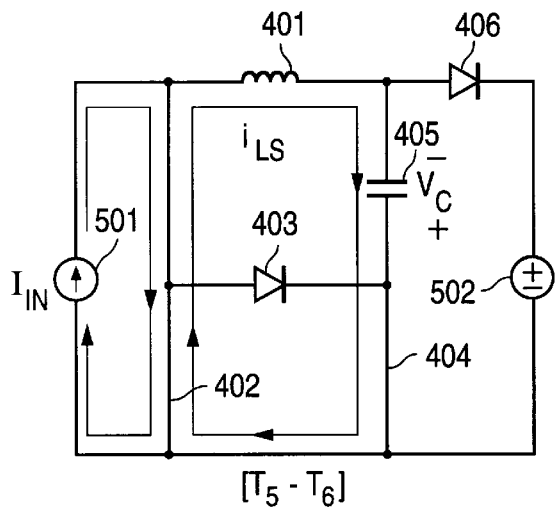
Figure 8G:
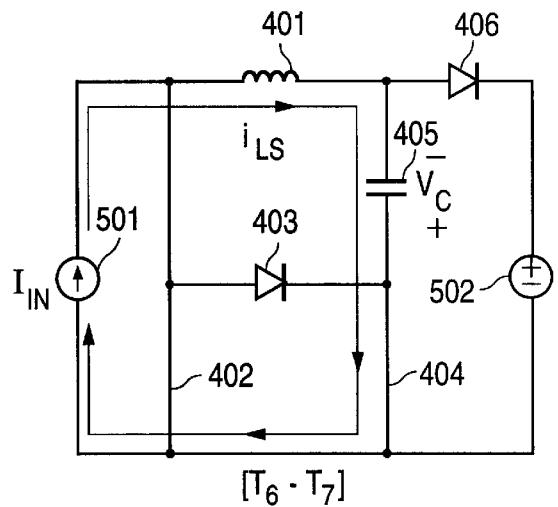
Figure 8H:
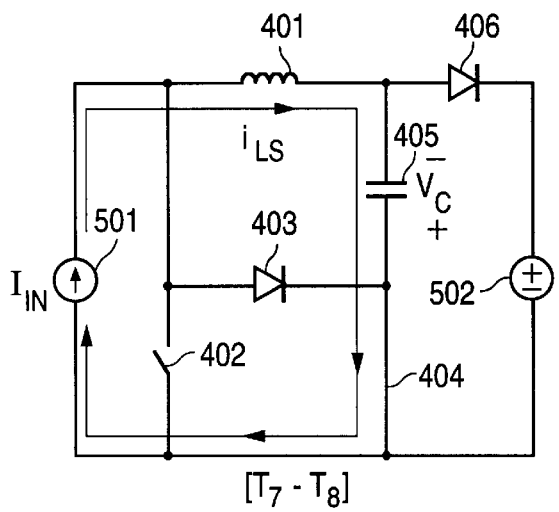
Figure 8I:
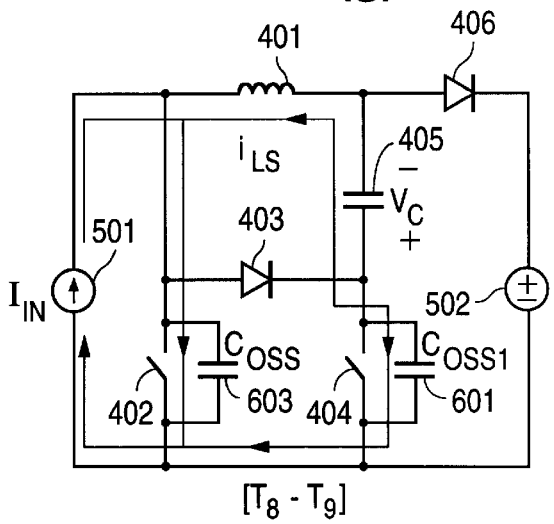
Figure 8J:
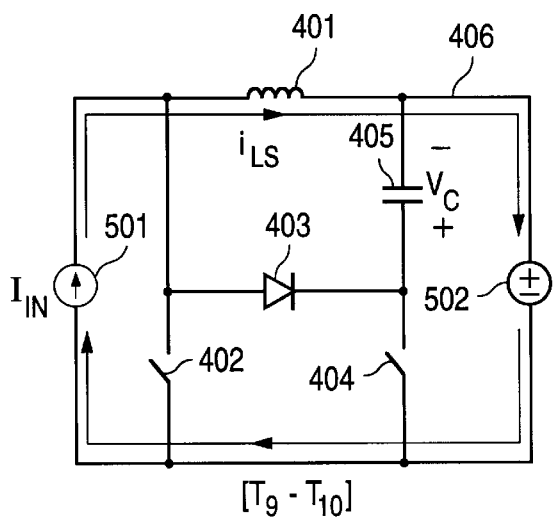

At time $t=T_0$, when boost switch 402 closes, voltage $V_O$ is impressed across snubber inductor 401, as shown in FIG. 6(a). As a result, inductor current $i_{LS}$ of snubber inductor 401 (waveform 706) and current $i_D$ of boost rectifier 406 (waveform 710) decrease linearly, while current $i_s$ (waveform 705) in boost switch 402 increases at the same rate. The rate of the change in rectifier current $i_D$ of boost rectifier 406 is given by:

$$\frac{di_D}{dt} = -\frac{V_O}{L_S} \quad (1)$$

Since the rate of decrease of rectifier current $i_D$ is controlled by inductance $L_S$ of snubber inductor 401, the rectifier recovered charge and the associated losses can be reduced by a proper selection of inductance $L_S$. Generally, a larger $L_S$, which gives a lower rate of decrease of rectifier current $i_D$, results in a more efficient reduction of the reverse-recovery-associated losses, as pointed out by Kersonsky et al.

Figure 6B:
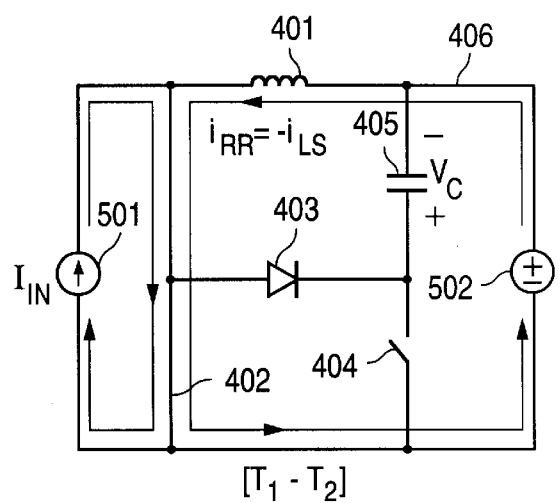
Figure 6C:
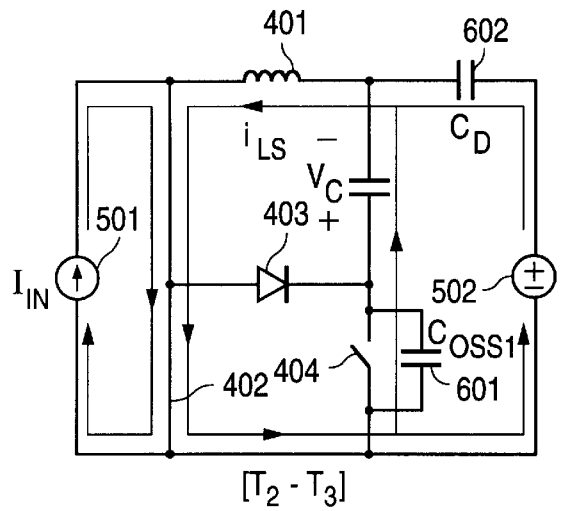

At time $t=T_1$, when current iLS of snubber inductor 401 and current $i_D$ of boost rectifier 406 decrease to zero, input current $I_{IN}$ flows through boost switch 402, as shown in FIG. 6(b) and illustrated by waveforms 706 ($i_{LS}$), 710 ($i_D$) and 705 ($i_S$). Ideally, when current $i_D$ of rectifier 406 falls to zero at time $t=T_1$, boost rectifier 406 should become non-conducting. However, due to a residual stored charge, reverse-recovery current $i_{RR}$ will flow in boost rectifier 406, as shown in FIG. 6(b). At time $t=T_2$, the stored charge is recovered from the junction of boost rectifier 406 and boost rectifier 406 becomes non-conducting, and voltage $V_D$ (waveform 711) across boost rectifier 406 begins to rise toward $V_O+V_C$. Consequently, a resonant circuit is formed by snubber inductor 401, snubber capacitor 405 ($C_C$), output capacitance 601 ($C_{OSS1}$) of auxiliary switch 404, and junction capacitor 602 ($C_D$) of boost rectifier 406, as shown in FIG. 6(c). Thus, during the time period between $t=T_2$ and time $t=T_3$, voltage $V_{S1}$, (waveform 704) of auxiliary switch 404 at terminal 411 in FIG. 4 decreases from $V_O+V_C$ to zero in a resonant fashion. At time $t=T_3$, when voltage $V_{S1}$ at terminal 411 falls to zero, the peak resonant current ($I_{LS(PK)}$), which flows in the negative direction through snubber inductor 401, is given by:

$$I_{LS(PK)} = i_{LS}(t = T_3) = \frac{V_O + V_C}{\sqrt{\frac{L_S}{C_{EQ}}}} \quad (2)$$

where $C_{EQ}$, the equivalent capacitance of the resonant circuit, is provided by $$C_{EQ} = \frac{C_{OSS1} C_C}{C_{OSS1} + C_C} + C_D \approx C_{OSS1} + C_D$$

for a properly selected value $C_C$ of clamp capacitor 405 (i.e., $C_C >> C_{OSS1}$) From FIG. 6(c), the peak of current $i_C$ (waveform 708) of clamp capacitor 405 occurs at $t=T_3$, and is given by:

$$I^+_{c(max)} = i_C(t = T_3) = \frac{C_{OSS1}(V_O + V_C)}{(C_{OSS1} + C_D)\sqrt{\frac{L_S}{C_{EQ}}}} \quad (3)$$

Figure 6D:
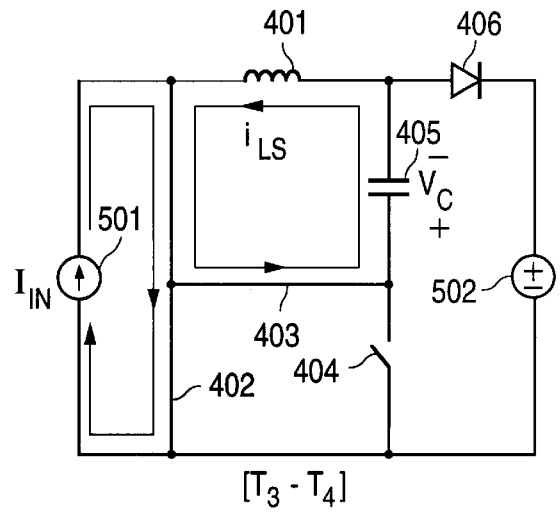

After voltage $V_{S1}$, (waveform 704) across auxiliary switch 404 falls to zero at time $t=T_3$, clamp diode 403 begins conducting, as shown in FIG. 6(d). When clamp diode 403 conducts, clamp capacitor voltage $V_C$ of clamp capacitor 405 is imposed across snubber inductor 401, so that snubber-inductor current $i_{LS}$ (waveform 706) increases linearly, as illustrated in FIG. 7. If capacitance $C_C$ of clamp capacitor 405 is large relative to output capacitance $C_{oss1}$ of auxiliary switch 404, capacitor voltage $V_C$ is substantially constant, and inductor current $i_{LS}$ increases and capacitor current $i_C$ decreases linearly and at the same rate (i.e., $$\frac{di_{LS}}{dt} = -\frac{di_C}{dt} = \frac{V_C}{L_S}.$$

Figure 6E:
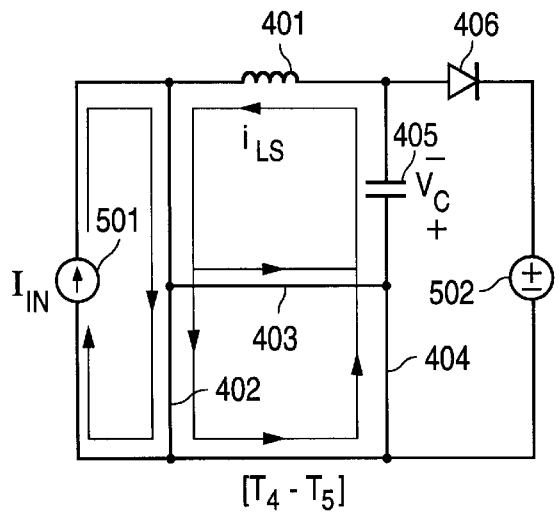
Figure 6F:
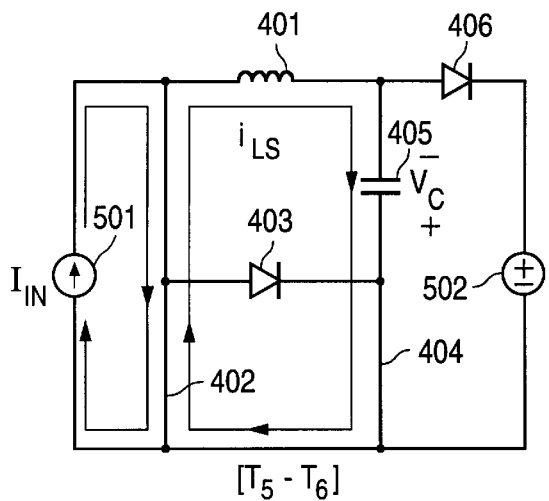

Otherwise, i.e., if capacitance $C_C$ of clamp capacitor 405 is not large relative to output capacitance $C_{OSS1}$ of auxiliary switch 404, current $i_{LS}$ of snubber inductor 401 and current $i_C$ of clamp capacitor 405 change in a resonant fashion. At time $t=T_5$, when current $i_C$ reaches zero, clamp diode 403 becomes non-conducting. As shown in FIG. 7, to achieve zero-voltage switching (ZVS) of auxiliary switch 404, auxiliary switch 404 is closed prior to time $t=T_5$, i.e., while clamp diode 403 is conducting (e.g., time $t=T_4$). After auxiliary switch 404 is closed at time $t=T_4$, at least some portion of current $i_{LS}$ (waveform 706) of snubber inductor 401 flows in auxiliary switch 404. The magnitude of current $i_{S1}$ (waveform 707) depends on the relative on-impedances of the current path through boost switch 402 and auxiliary switch 404 and the on-impedance of clamp diode 403, as shown in FIG. 6(e). Since auxiliary switch 404 begins to conduct after clamp diode 403 becomes non-conducting at time $t=T_5$, current $i_{S1}$ of auxiliary switch 404 continues to increase linearly, as illustrated in FIG. 6(f). At the same time, current is of boost switch 402 decreases at the same rate, since the sum of currents $i_{S1}$ and $i_s$ (waveforms 707 and 705, respectively) equals input current $I_{IN}$.

Figure 6G:
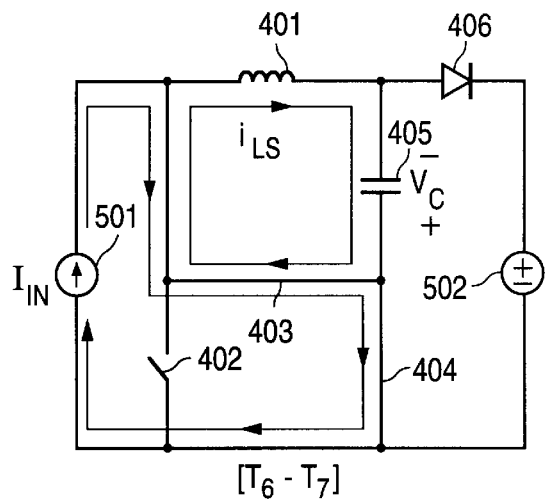
Figure 6H:
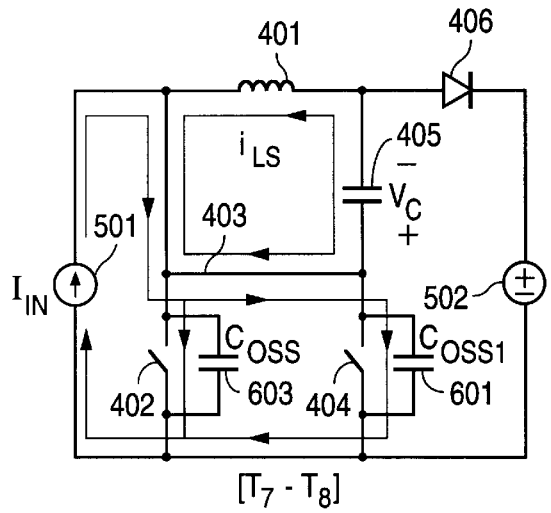
Figure 6I:
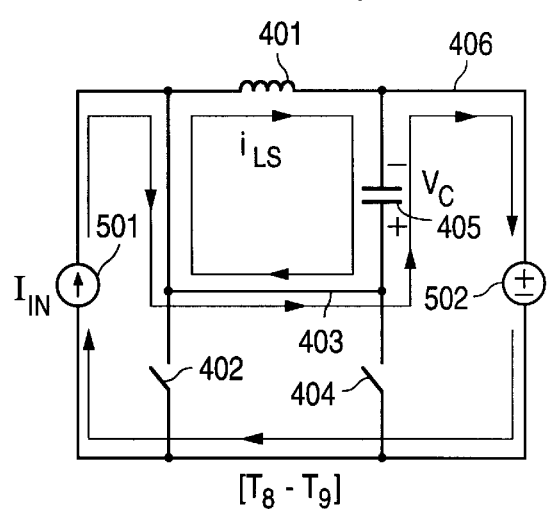

When boost switch 402 opens at time $t=T_6$, current $i_s$ becomes zero rapidly, and current $i_{S1}$ increases rapidly by the amount equal to current $i_s$ immediately prior to time $t=T_6$, as clamp diode 403 becomes conducting, as shown in FIG. 6(g). Voltage $v_s$ across boost switch 402 is clamped to zero by conducting clamp diode 403 and auxiliary switch 404. As a result, boost switch 402 is opened with a reduced current stress and at zero voltage. When boost switch 402 opens at time $t=T_6$, current is of boost switch 402 is smaller than input current $I_{IN}$, as shown in FIG. 7. In fact, boost power stage 400 can be designed to achieve complete zero-current switching of boost switch 402, as discussed below. During the time interval between time $t=T_6$ and time $t=T_7$, input current $I_{IN}$ flows in auxiliary switch 404, as clamp capacitor 405 continues to discharge through snubber inductor 401, as shown in FIG. 7 and by currents $i_C$ and $i_{LS}$ (waveforms 708 and 706, respectively). Auxiliary switch 404 opens at time $t=T_7$, so that current $I_{IN}$ begins to charge output capacitance 601 ($C_{OSS1}$) of auxiliary switch 404 and output capacitance 603 ($C_{OSS}$) of boost switch 402, as shown in FIG. 6(h). Consequently, voltages $v_S$ and $v_{S1}$ (waveforms 703 and 704, respectively) across boost switch 402 and auxiliary switch 404 each begin to increase linearly from zero to $V_O+V_C$. When voltages $v_s$ and $v_{S1}$ across boost switch 402 and auxiliary switch 404, respectively, each reach $V_O+V_C$ at time $t=T_8$, boost rectifier 406 becomes conducting, as shown in FIG. 6(i). During the time interval between time $t=T_8$ and time $t=T_9$, current $i_{LS}$ (waveform 706) of snubber inductor 401 continues to increase toward $I_{IN}$, while clamp capacitor 405 is charged by current $i_C$ (waveform 708), which is equal to the difference between input current $I_{IN}$ and current $i_{LS}$ of snubber inductor 401 (i.e., $i_C=I_{IN}-i_{LS}$).

Figure 6J:
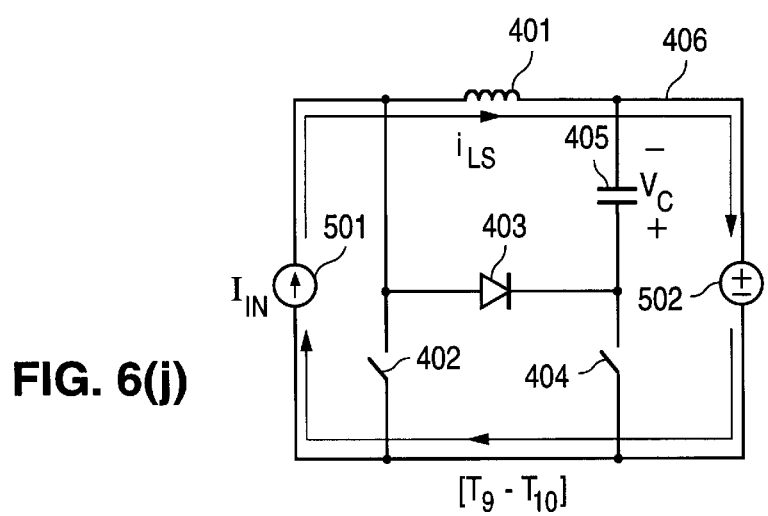

At time $t=T_9$, current $i_{LS}$ of snubber inductor 401 reaches input current $I_{IN}$, clamp diode 403 becomes non-conducting and input current $I_{IN}$ flows in boost rectifier 406, as shown in FIG. 6(j), until the next switching cycle, which is initiated in FIG. 7 at time $t=T_{10}$.

Thus, as illustrated by waveforms 701–711 of FIG. 7, if current $i_C$ of clamp capacitor 405, at the moment when boost switch 402 is opened, is equal to input current $I_{IN}$, boost switch 402 can be opened under a complete ZCS condition:

$$i_C(t=T_6)=I_{IN} \quad (4)$$

Moreover, if the time interval between time $t=T_6$ and time $t=T_7$ is kept much shorter than the time interval between time $t=T_5$ and time $t=T_6$, current $i_C$ of clamp capacitor 406 is substantially the same:

$$i_C(t=T_6) \approx i_C(t=T_7) = I^-_{C(max)} \quad (5)$$

where $I^-_{C(max)}$ is the maximum discharging current of clamp capacitor 405, as indicated by waveform 708 of FIG. 7. Thus, the ZCS condition for boost switch 402 can be defined as $$I^-_{C(max)}=I_{IN} \quad (6)$$

For a system where Eq. (6) holds, clamp capacitor 405 charges only during the time interval between time $t=T_2$ and time $t=T_5$, i.e., current $i_C$ is zero during the time interval between time $t=T_8$ and time $t=T_9$. If the time interval between time $t=T_2$ and time $t=T_3$ is much shorter than the time interval between time $t=T_2$ and time $t=T_5$, charge conservation requires that:

$$I^-_{C(max)}=i_C(t=T_3) \approx I^-_{C(max)} \approx I_{IN} \quad (7)$$

Thus, from Eqs. (3), (4) and (7), the ZCS condition can be written as:

$$\frac{1}{C_{OSS1}}\sqrt{L_S(C_{OSS1}+C_D)} \leq \frac{V_O+V_C}{I_{IN}} \quad (8)$$

If Eq. (8) is satisfied at the maximum power, i.e., when $I_{IN}=I_{IN(max)}$, complete ZCS of boost switch 402 is achieved in the full load range. Since auxiliary switch 404 and boost rectifier 406 are both switching under ZVS condition, external capacitance can be added across auxiliary switch 404 or boost rectifier 406 without incurring additional switching losses. Thus, for given values of voltage $V_O$, current $I_{IN}$, inductance $L_S$, clamp voltage $V_C$, and for selected component values $C_{OSS1}$ and $C_D$, an external capacitor can be added in parallel with $C_{OSS1}$ or $C_D$ to adjust the effective values of $C_{OSS1}$ and $C_D$ to achieve complete ZCS for boost switch 402. As shown from FIG. 7, since the voltage stress of boost switch 402, auxiliary switch 404, and boost rectifier 406 is $V_O+V_C$, the voltage stress in boost switch 402 in boost power stage 400 is higher than in a conventional "hard-switched" boost converter by voltage $V_C$. Thus, clamp voltage $V_C$ is carefully selected to keep the voltage stresses of boost switch 402 and auxiliary switch 404 within reasonable limits.

Determination of voltage $V_C$ can be simplified when the following conditions hold: (a) boost power stage 400 is designed such that reverse-recovery-related losses are minimized and complete ZCS condition in boost switch 402 is achieved; (b) the rectifier-current commutation interval $T_O-T_2$ is much shorter than the conducting "on-time" period $T_{ON}$ of boost switch 402, (c) capacitor charging current during the time period between time $t=T_8$ and time $t=T_9$ is zero, and (d) the durations of the commutation periods $T_2-T_3$ and $T_7-T_8$ are negligible compared to $T_{ON}$. As shown in FIG. 7, from time period $t=T_3$ to time $t=T_5$, current $i_C$, which charges clamp capacitor 405, has a constant slope of given by $$\frac{di_C}{dt}=\frac{V_C}{L_S}.$$

As provided in Eq. (7) above, to achieve ZCS condition in boost switch 402, $I_{C(max)}^+=i_C(t=T_3) \approx I_{C(max)}^- \approx I_{IN}$. Further, since the time interval between time $t=T_3$ and time $t=T_5$ is approximately one-half of $T_{ON}$, clamp-capacitor voltage $V_C$ is given by:

$$V_C \approx L_S \frac{I_{IN}}{\frac{DT_S}{2}} = \frac{2L_S f_S I_{IN}}{D} \quad (9)$$

where D is the duty cycle of signal S (waveform 701), $T_S$ is the switching cycle (i.e., $T_{ON}+T_{OFF}$), and $f_S$ is the switching frequency. For a lossless boost power stage in which the current commutation interval between time $t=T_0$ and time $t=T_2$ is much shorter than $T_{ON}$, the voltage-conversion ratio $$\frac{V_O}{V_{IN}}$$

is given by:

$$\frac{V_O}{V_{IN}} = \frac{I_{IN}}{I_O} = \frac{1}{1-D} \quad (10)$$

Substituting for D and $I_{IN}$ in Eq. (9):

$$V_C \approx 2L_S f_S I_O \left(\frac{V_O^2}{(V_O-V_{IN})V_{IN}}\right) \quad (11)$$

Thus, according to Eq. (11), voltage $V_C$ is maximum at full load (i.e., $I_O=I_{O(max)}$) and high line voltage (e.g., $V_{IN}=V_{IN\ (max)}$). For given input and output specifications (i.e., given $I_{O(max)}$ and $V_{IN(max)}$) and voltage $V_O$, clamp capacitor voltage $V_c$ can be minimized by minimizing the $L_S f_S$ product.

Figure 9:
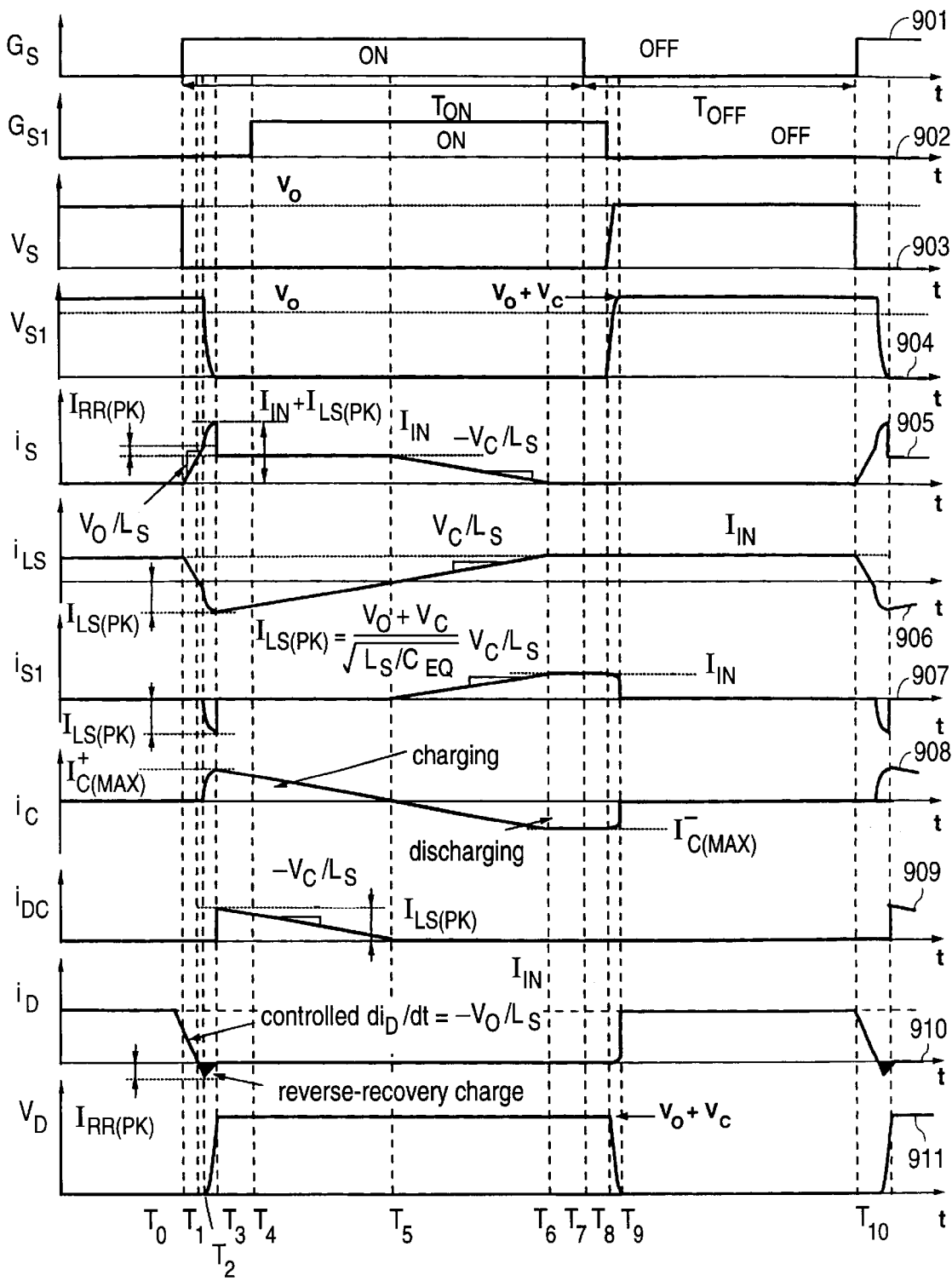
FIG. 9 shows key waveforms of boost power stage 400, when input current $I_{IN}$ is less than the peak current ($I_{LS(PK)}$) in snubber inductor 401.

During light load operation, input current $I_{IN}$ is less than the peak resonant current $I_{LS(PK)}$ provided in Eq.(2), and clamp capacitor 405 is fully charged and discharged within the time period $T_{ON}$ between time t=$T_1$ and time t=$T_6$. Light load operation of boost power stage 400 is illustrated by FIGS. 8 and 9. FIGS. 8(a)–8(j) show topological stages of boost power stage 400, in which input current $I_{IN}$ is less than the peak current ($I_{LS(PK)}$) in snubber inductor 401. FIG. 9 shows key waveforms of boost power stage 400, when input current $I_{IN}$ is less than the peak current ($I_{LS(PK)}$) in snubber inductor 401.

FIGS. 8(a)–8(e), which correspond to a light load operation during the time period between time t=$T_0$ and time t=$T_5$, are substantially identical to FIGS. 6(a)–6(e), which correspond to full load operation over the same time period. Similarly, in FIG. 9, the portions of waveforms 901–911 between times t=$T_0$ and t=$T_5$, corresponding to key waveforms under light load operation, are substantially identical to corresponding portions of waveforms 701–711 under full load operation. However, under a light load operation, since current $i_{LS}$ (waveform 906) of snubber inductor 401 reaches input current $I_{IN}$ prior to boost switch 402 opens at time t=$T_7$ (waveform 901), auxiliary switch 404 carries input current $I_{IN}$ during the time interval between time t=$T_6$ and time t=$T_9$. The analysis provided above with respect to full load operation is equally applicable to the light load operations of FIGS. 8(a)–8(j) and FIG. 9, and thus is not repeated.

Figure 10:
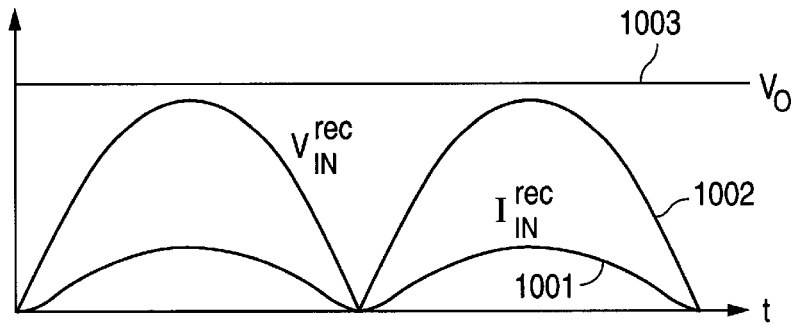
FIG. 10 shows desired input current waveform ($I^{REC}_{IN}$) 1001, input voltage waveform ($V^{REC}_{IN}$) 1002, and output voltage waveform ($V_O$) in input-current-shaping applications.
Figure 11:
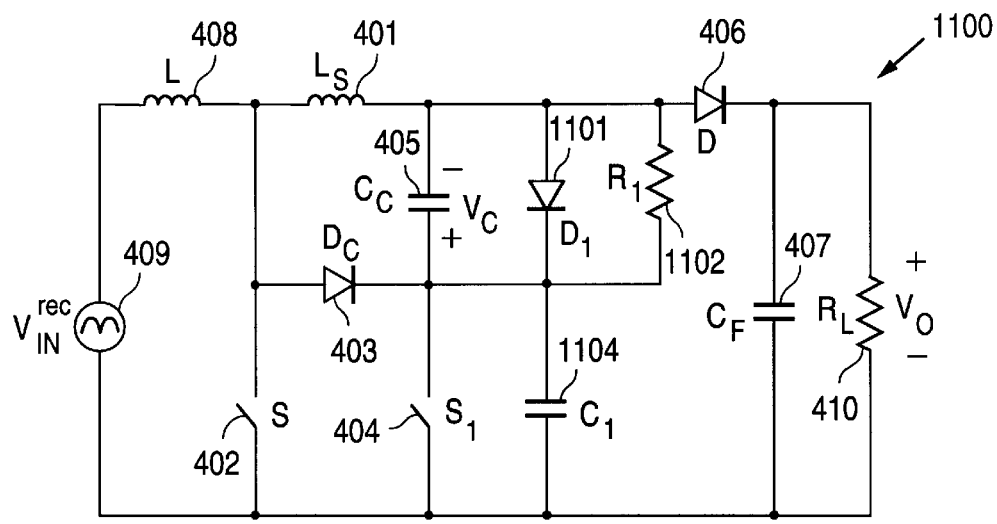
FIG. 11 shows boost power stage 1100, including diode 1101 and resistor 1102 provided across clamp capacitor 405.

As mentioned above, a boost converter is often used in input current shaping applications. Input-current shaping in a power supply both reduces the harmonic content and improves the power factor of the line current. FIG. 10 shows desired input current waveform ($I_{IN}^{REC}$) 1001, input voltage waveform ($V_{IN}^{REC}$) 1002, and output voltage waveform ($V_O$) 1003 in an input-current-shaping application. Because in an input-current-shaping application, input voltage $V_{IN}$ varies during a line cycle, and output voltage $V_O$ is constant, the duty cycle of boost rectifier 406 varies from 0% to 100%. Moreover, when the instantaneous input voltage is near zero, the stored energy in boost inductor 408 may be insufficient to charge clamp capacitor 405. Therefore, to maintain proper operation in boost power stage 400, clamp voltage $V_C$ is kept positive to provide needed volt-seconds for resetting snubber inductor 401. To ensure a positive voltage $V_C$, boost power stage 1100 of FIG. 11 is obtained by modifying boost power stage 400 of FIG. 4. FIG. 11 shows boost power stage 1100, including diode 1101 and resistor 1102 provided across clamp capacitor 405. Resistor 1102 is connected across clamp capacitor 405 to prevent excessive charging of clamp capacitor 405 when the duty cycle of boost power stage 1100 is at the minimum around the peaks of the line voltage. In boost power stage 1100, capacitor 1104, which is provided in parallel with auxiliary switch 404, optimizes the magnitude of current $I_{C(max)}^+$ so that boost switch 402 is opened under ZCS conditions.

The control of boost power stage 400 or boost power stage 1100 can be implemented in substantially same way as conventional "hard-switched" power converters, so long as an additional gate-driver circuit is provided. Specifically, in an input-current-shaping application, boost power stage 400 or boost power stage 1100 can be implemented with any known control technique, such as average-current, peak-current, or hysteretic control.

The performance of boost power stage 400 with an active snubber was experimented on a 1 kW (375 V/2.67 A), universal-line-range (90–265 $V_{AC}$) power-factor-correction circuit operating at 80 kHz. The experimental circuit has these components: boost switch 402 is provided by an IXGK50N60 IGBT; auxiliary switch 404 is provided by a 2SK2837 MOSFET; boost rectifier 406 is provided by two RHRP3060 rectifiers connected in parallel; boost inductor 408 is provided by a 0.8 mH inductance; snubber inductor 401 is provided by a 4.7 $\mu$H inductor; snubber rectifier 403 is provided by a RHRP3060 rectifier, and filter capacitor 407 is provided by two 470 $\mu$F/450 V capacitors connected in parallel. Boost inductor 408 was built using Magnetics toroidal core (Kool Mu 77439-A7, two cores in parallel) and 55 turns of AWG#14 wire, and snubber inductor 403 was built with Magnetics toroidal core (MPP 55550-A2, two cores in parallel) with 9 turns of AWG#14 wire. Providing a 4.7 $\mu$H inductor for snubber inductor 401 limits the rate of turn-off snubber rectifier current change (di/dt) to di/dt=$V_O$/$L_S$=80 A/$\mu$s. The control circuit for the experimental circuit was implemented with an average-current PFC controller UC3854. TC4420 and TSC429 drivers are used to generate the required gate-drive signals for the boost switch 402 and auxiliary switch 404, respectively.

Table 1 shows the measured efficiencies of the experimental converter with and without the active snubber at the minimum and maximum line voltages, as functions of the output power. As shown in Table 1, for both line voltages, the active snubber improves the conversion efficiency at higher output-power levels (e.g., >600 W). Nevertheless, the efficiency improvement is more pronounced at the minimum line and higher power levels where the reverse-recovery losses are greater. Specifically, at the maximum line (265 $V_{AC}$), the efficiency improvement at 1 kW is 0.3%. However, at the minimum line voltage, without the active snubber, the boost power stage cannot deliver more than approximately 900 W due to thermal runaway of the boost rectifier as a result of excessive reverse-recovery losses. At 900 W, the active snubber improves the efficiency by approximately 3%, which translates into approximately 30% reduction of the losses.

TABLE 1

Measured efficiency of the experimental boost converter input-current-shaper in the 200-W to 1-kW range at the minimum line voltage (90 $V_{AC}$) and maximum line voltage (264 $V_{AC}$) with and without the active snubber of the present invention:

| Power (W) | Without active snubber | | with active snubber | |
| --- | --- | --- | --- | --- |
| | $V_{IN}$ = 90 $V_{AC}$ | $V_{IN}$ = 264 $V_{AC}$ | $V_{IN}$ = 90 $V_{AC}$ | $V_{IN}$ = 264 $V_{AC}$ |
| 200 | 94.2% | 97.5% | 93.2% | 96.6% |
| 300 | 93.9% | 97.8% | 93.4% | 97.1% |
| 400 | 93.6% | 98.1% | 93.3% | 97.5% |
| 500 | 93.2% | 97.8% | 93.8% | 97.5% |
| 600 | 93.0% | 98.0% | 94.4% | 97.8% |
| 700 | 92.7% | 97.9% | 94.5% | 98.5% |
| 800 | 92.0% | 97.8% | 93.8% | 98.6% |
| 900 | 90.5% | 98.1% | 93.4% | 98.5% |
| 1000 | n/a | 98.1% | 92.5% | 98.4% |

Figures 12, 13:
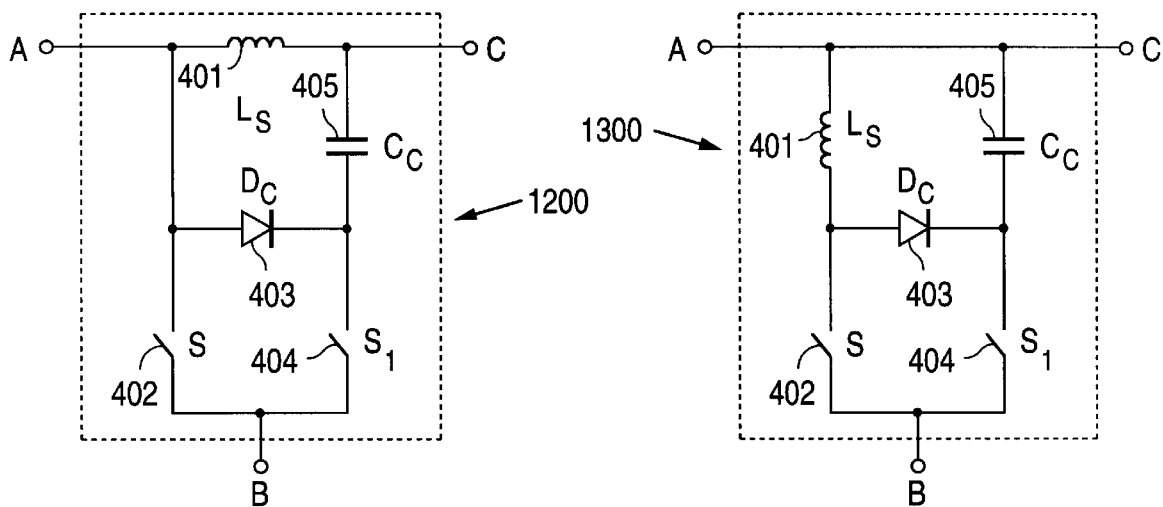
FIG. 12 shows configuration 1200 ("Type A"), which is one implementation of 3-terminal ZC-ZVS cell 450; with configuration 1200, boost inductor 408 connects to the common point between the boost switch 402 and snubber inductor 401.
FIG. 13 shows configuration 1300 ("Type B"), which is one implementation of 3-terminal ZC-ZVS cell 450; with configuration 1300, boost inductor 408 connects to the common point between the anode of boost rectifier 406 and snubber inductor 401.

Generally, ZC-ZVS cell 450 can be implemented either as configuration 1200 ("Type A") shown in FIG. 12, or as configuration 1300 ("Type B") shown in FIG. 13. In either of configurations 1200 and 1300, terminal A connects to a current source point of the power stage (e.g. the output terminal of boost inductor 408), terminal C connects to the power-stage rectifier (e.g., boost rectifier 406), and terminal B connects to the input-voltage source, or the common ground of the power stage. Thus, with configuration 1200, boost inductor 408 connects to the common point between boost switch 402 and snubber inductor 401. Similarly, with configuration 1300, boost inductor 408 connects to the common point between terminal C and snubber inductor 401.

Figure 14:
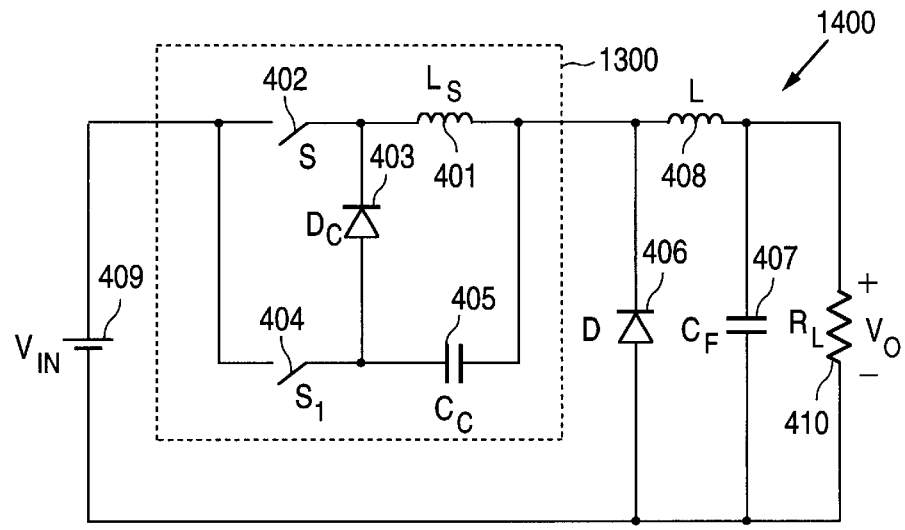
FIG. 14 shows an application of ZC-ZVS cell 1300 in buck converter 1400.
Figure 15:
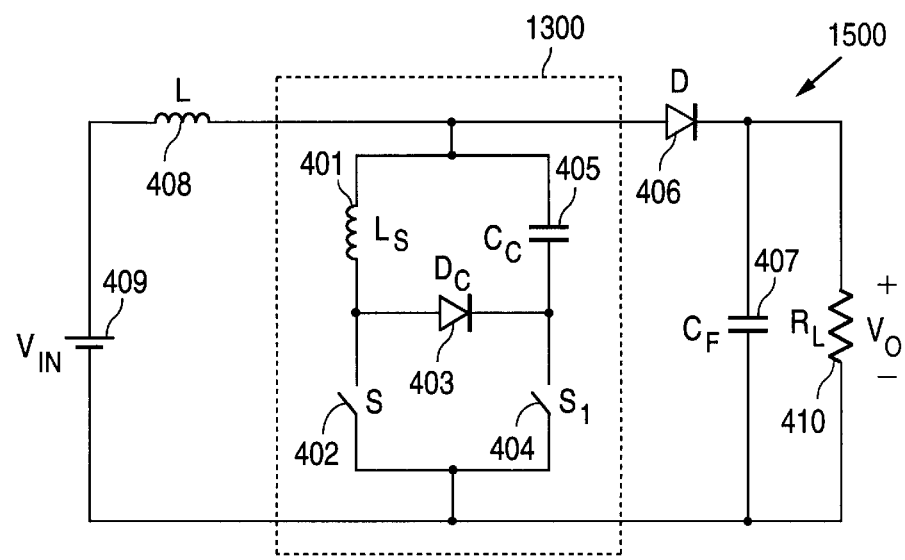
FIG. 15 shows an application of ZC-ZVS cell 1300 in boost converter 1500.
Figure 16:
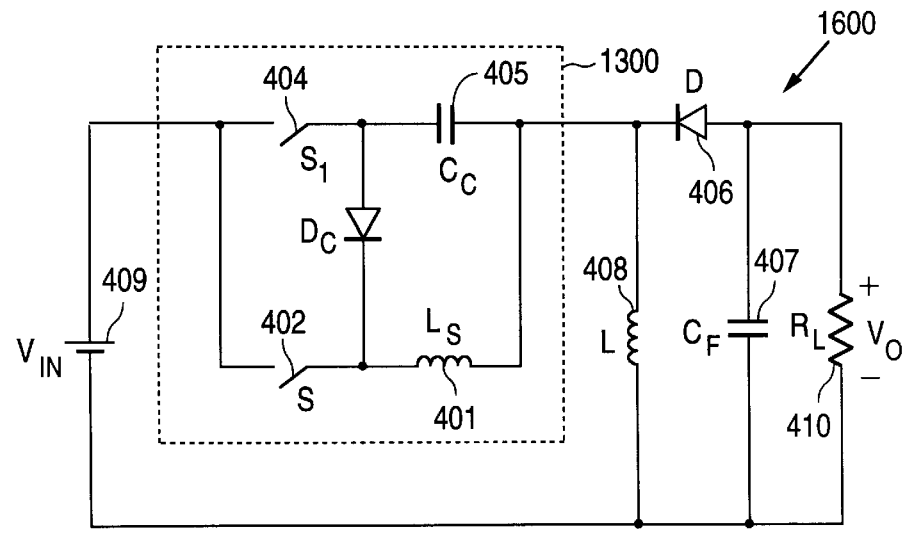
FIG. 16 shows an application of ZC-ZVS cell 1300 in buck-boost converter 1600.
Figure 17:
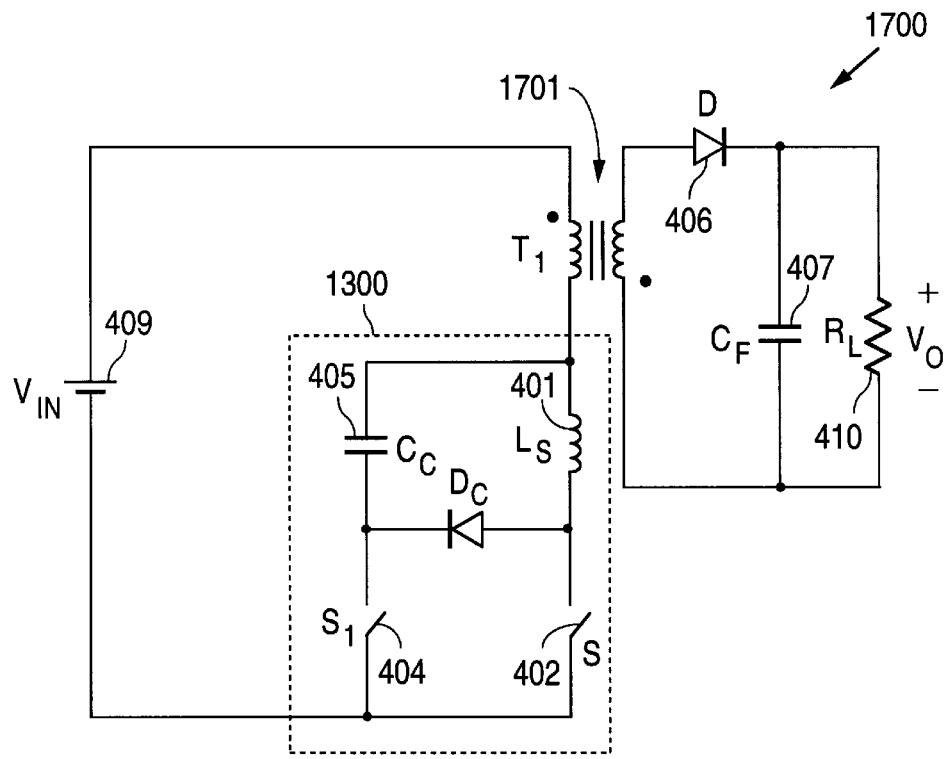
FIG. 17 shows an application of ZC-ZVS cell 1300 in flyback converter 1700.
Figure 18:
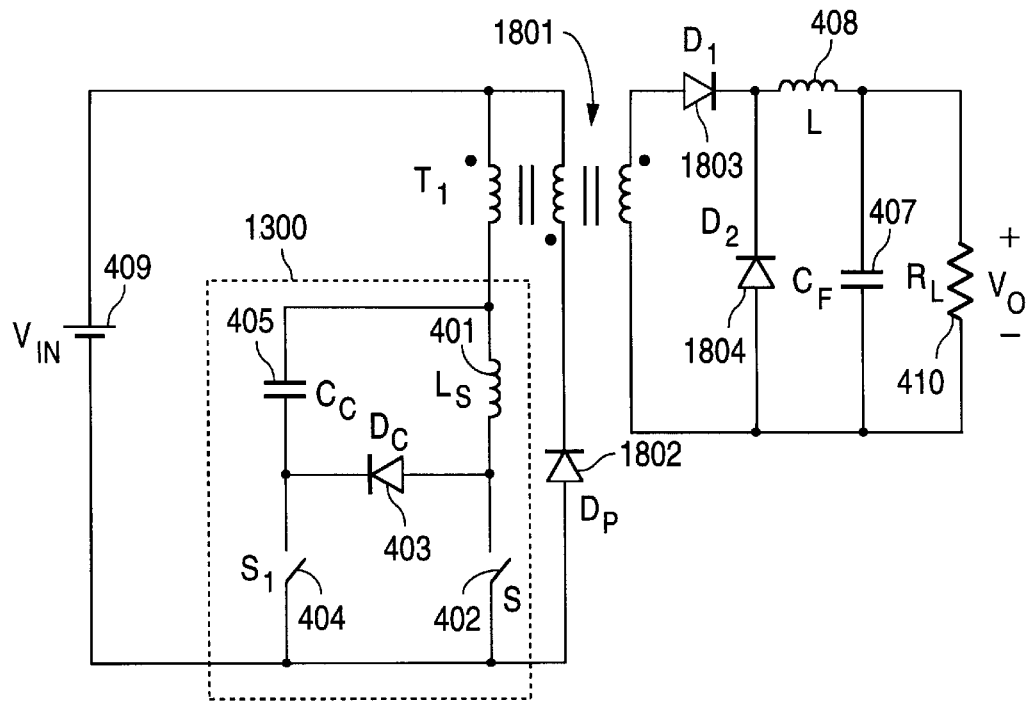
FIG. 18 shows an application of ZC-ZVS cell 1300 in forward converter 1800.
Figure 19:
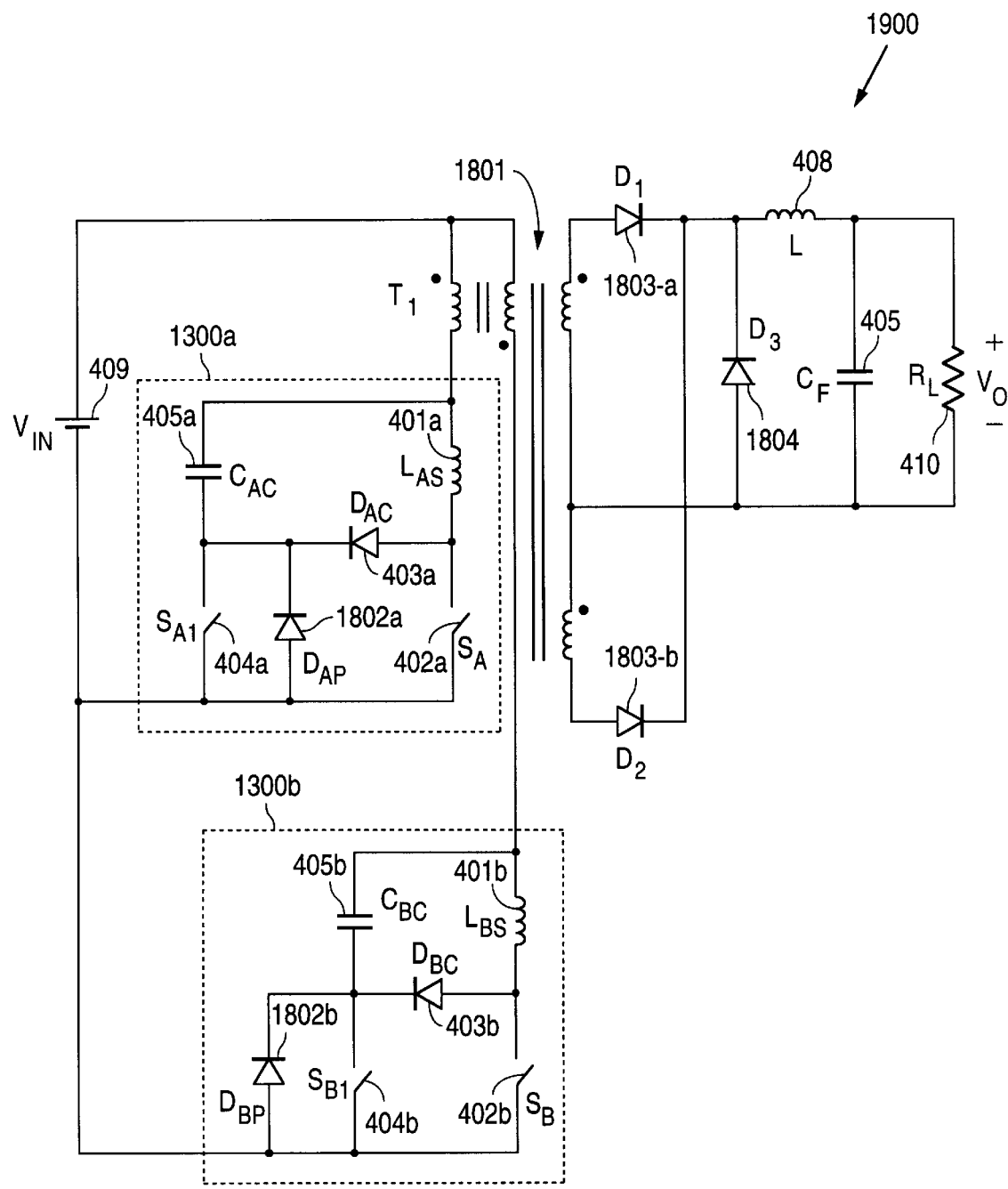
FIG. 19 shows an application of ZC-ZVS cell 1300 in interleaved forward converter 1900.
Figure 20:
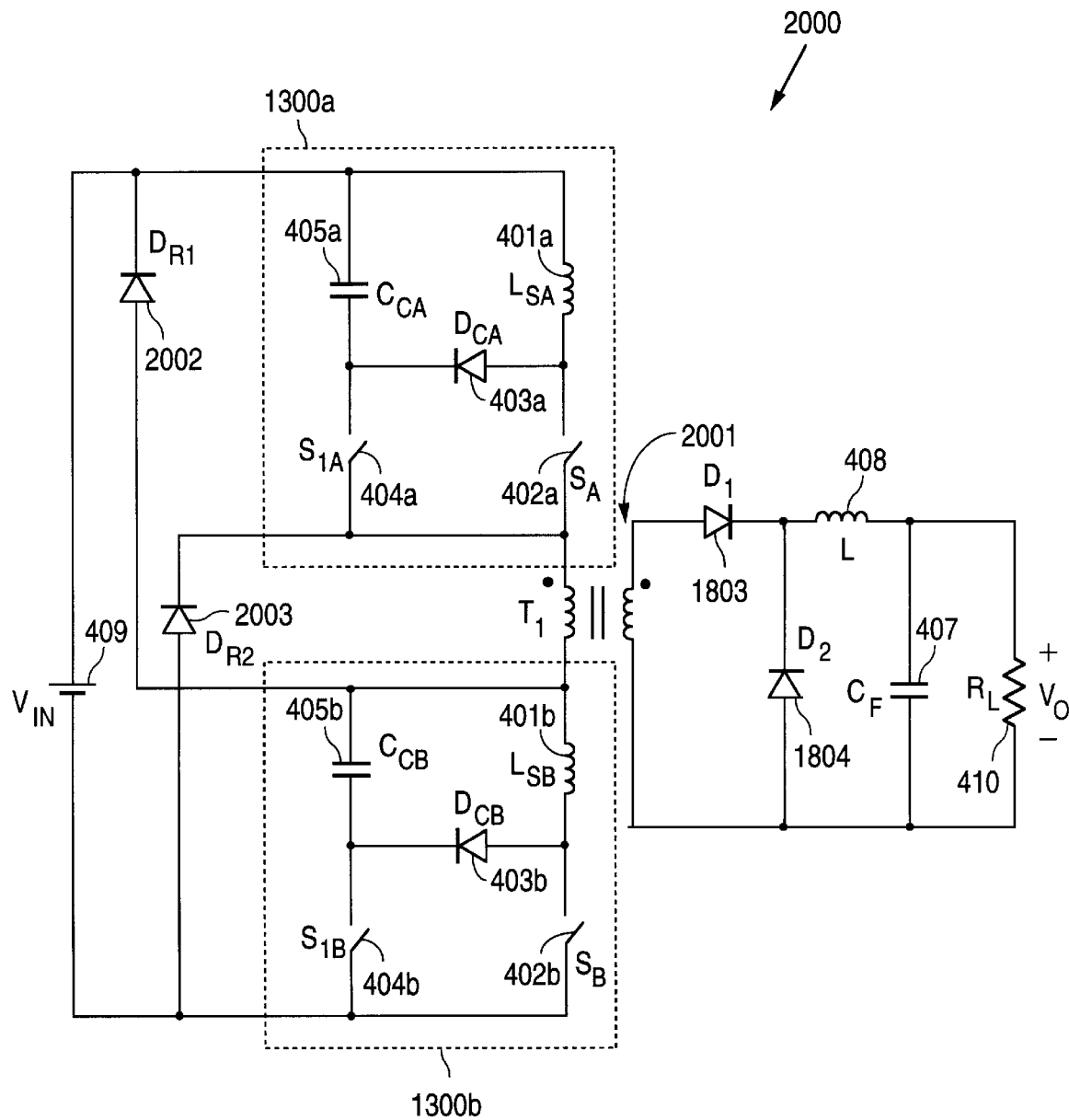
FIG. 20 shows an application of ZC-ZVS cell 1300 in two-switch forward converter 2000.
Figure 21:
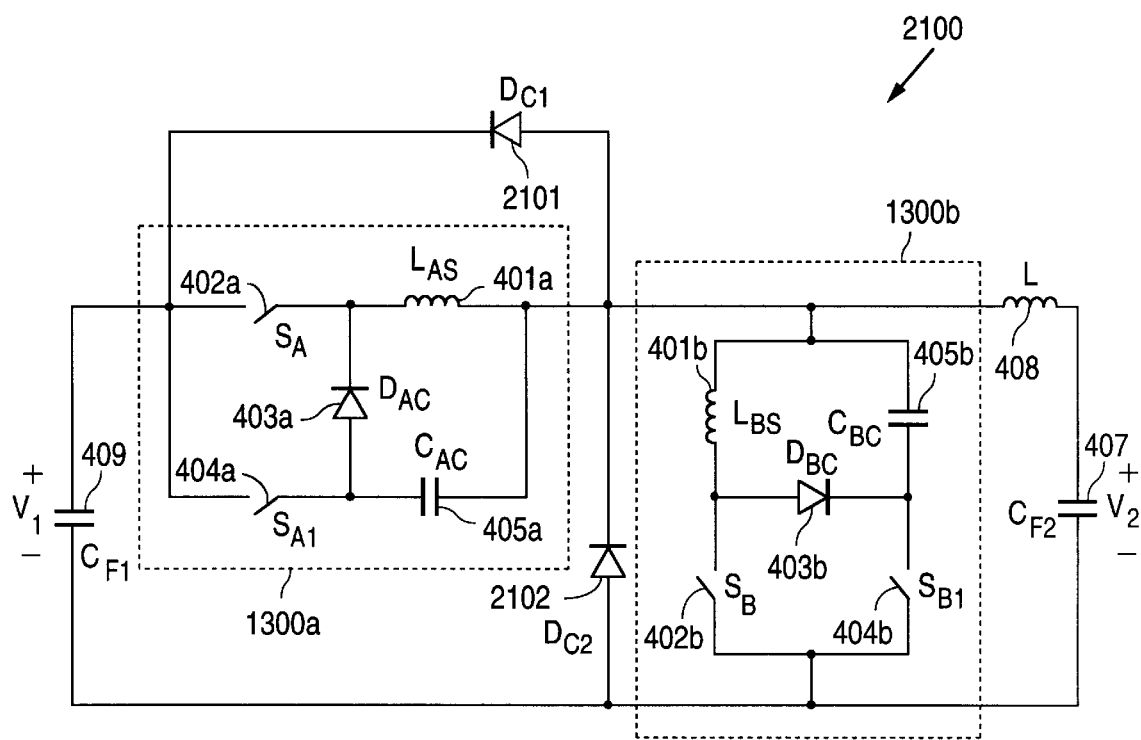
FIG. 21 shows an application of ZC-ZVS cell 1300 in bi-directional converter 2100.
Figure 22:
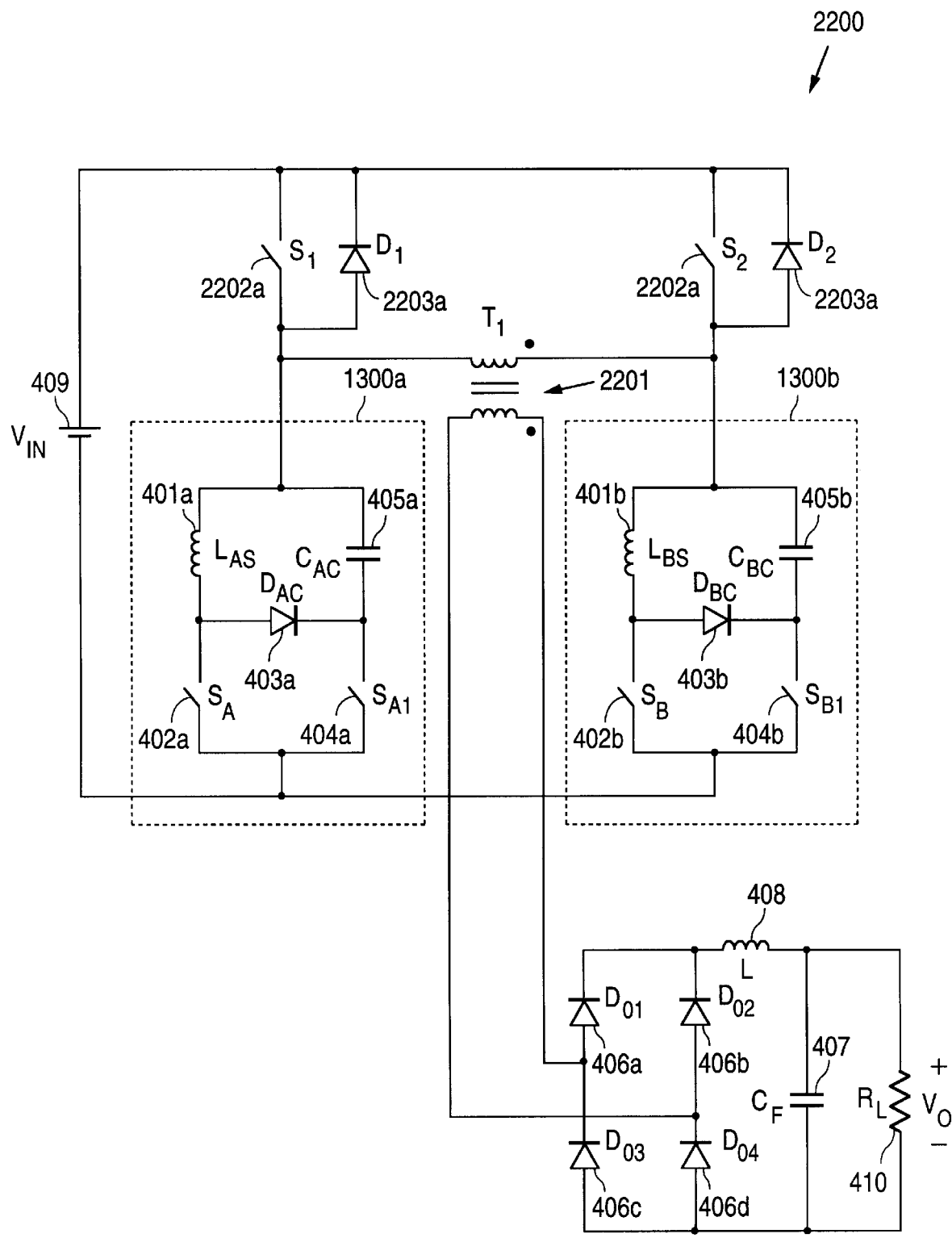
FIG. 22 shows an application of ZC-ZVS cell 1300 in voltage-fed full-bridge converter 2200.
Figure 23:
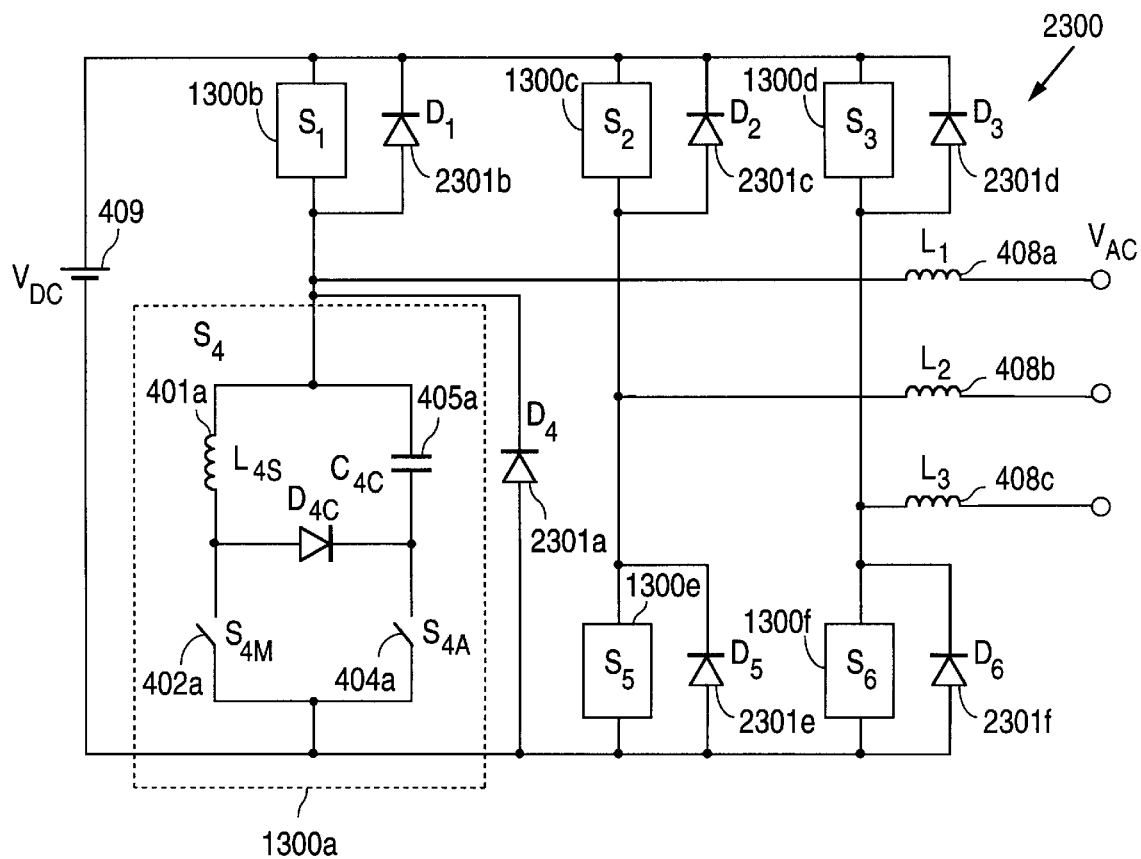
FIG. 23 shows an application of ZC-ZVS cell 1300 in three-phase rectifier 2300.

ZC-ZVS cell 450 can be used in conjunction with other power converters. For example, FIGS. 14, 15, and 16 show, respectively, applications of ZC-ZVS cell 1300 in buck converter 1400, boost converter 1500, and buck-boost converter 1600. Similarly, FIGS. 17, 18, 19, 20, 21 and 22 show, respectively, applications of ZC-ZVS cell 1300 in flyback converter 1700, forward converter 1800, interleaved forward converter 1900, two-switch forward converter 2000, bi-directional converter 2100, and voltage-fed full-bridge converter 2200. FIG. 23 shows an application of ZC-ZVS cell 1300 in three-phase rectifier 2300.

The above detailed description is provided to illustrate specific embodiments of the present invention and is not intended to be limiting. Numerous variations and modification within the scope of the invention are possible. The present invention is set forth in the following claims.

We claim:

1. A power converter including a zero-current, zero-voltage switching (ZC-ZVS) cell, said ZC-ZVS cell having a first terminal, a second terminal and a third terminal, said ZC-ZVS cell comprising:
   a diode;
   a first switch coupled between said second terminal and an anode of said diode;
   a second switch coupled between said second terminal and a cathode of said diode;
   a capacitor coupled between said third terminal and said cathode of said diode; and
   an inductor coupled between said anode of said diode and said third terminal.

2. A power converter as in claim 1, wherein said anode of said diode is coupled to said first terminal.

3. A power converter as in claim 1, wherein said first and third terminals are shorted.

4. A power converter as in claim 1, wherein said power converter comprises a three-phase rectifier.

5. A power converter as in claim 1, further comprising a second diode coupled across said second switch.

6. A power converter as in claim 1, further comprising a second diode coupled across the terminals of said capacitor.

7. A power converter as in claim 1, further comprising a resistor coupled across the terminals of said capacitor.

8. A power converter as in claim 1, further comprising a second capacitor coupled across said second switch.

9. A power converter as in claim 1, wherein said first switch and second switch are closed over overlapping time intervals.

10. A power converter as in claim 9, wherein said overlapping time intervals, said first switch is closed prior to a closing of said second switch, and wherein said first switch is opened prior to an opening of said second switch.

11. A power converter as in claim 1, wherein said first switch comprises an insulated gate bipolar transistor.

12. A power converter as in claim 1, wherein said second switch comprises a field effect transistor.

13. A power converter as in claim 1, wherein said first switch comprises a field effect transistor.

14. A power converter as in claim 1, wherein said second switch comprises an insulated gate bipolar transistor.

15. A power converter as in claim 1, wherein said power converter comprises a boost converter.

16. A power converter as in claim 1, wherein said power converter comprises a buck converter.

17. A power converter as in claim 1, wherein said power converter comprises a buck-boost converter.

18. A power converter as in claim 1, wherein said power converter comprises a flyback converter.

19. A power converter as in claim 1, wherein said power converter comprises a forward converter.

20. A power converter as in claim 1, wherein said power converter comprises an interleaved forward converter.

21. A power converter as in claim 1, wherein said power converter comprises a two-switch forward converter.

22. A power converter as in claim 1, wherein said power converter comprises a bi-directional converter.

23. A power converter as in claim 1, wherein said power converter comprises a voltage-fed full-bridge converter.

* * * * *